(12) United States Patent
Tan

(10) Patent No.: US 8,907,679 B2
(45) Date of Patent: Dec. 9, 2014

(54) METER APPARATUS HAVING THREE-PHASE JUDGMENT FUNCTION

(75) Inventor: Po-Chao Tan, New Taipei (TW)

(73) Assignee: Brymen Technology Corporation, New Taipei (TW)

(*) Notice: Subject to any disclaimer, the term of this patent is extended or adjusted under 35 U.S.C. 154(b) by 263 days.

(21) Appl. No.: 13/486,915

(22) Filed: Jun. 1, 2012

(65) Prior Publication Data

US 2013/0285643 A1    Oct. 31, 2013

(30) Foreign Application Priority Data

Apr. 27, 2012   (TW) .............................. 101207888 U

(51) Int. Cl.
 *G01R 31/08*   (2006.01)
 *G01R 31/28*   (2006.01)
 *H01H 31/02*   (2006.01)

(52) U.S. Cl.
 USPC ........................... 324/522; 324/511; 324/555

(58) Field of Classification Search
 None
 See application file for complete search history.

(56) References Cited

U.S. PATENT DOCUMENTS

| | | | | |
|---|---|---|---|---|
| 3,555,417 | A | * | 1/1971 | Mitchell .......................... 324/86 |
| 4,023,101 | A | * | 5/1977 | Christoffer .................... 324/107 |
| 4,039,923 | A | * | 8/1977 | Vukasovic ...................... 363/79 |
| 4,210,906 | A | * | 7/1980 | Smith et al. ................... 340/659 |

* cited by examiner

*Primary Examiner* — Melissa Koval
*Assistant Examiner* — Courtney McDonnough
(74) *Attorney, Agent, or Firm* — Chun-Ming Shih; HDLS IPR Services

(57) ABSTRACT

A meter apparatus having three-phase judgment function includes a control unit, a multimeter measurement unit electrically connected to the control unit, a three-phase judgment unit electrically connected to the control unit, a first measurement jack electrically connected to the multimeter measurement unit and the three-phase judgment unit, a second measurement jack electrically connected to the multimeter measurement unit and the three-phase judgment unit, and a third measurement jack electrically connected to the multimeter measurement unit and the three-phase judgment unit.

3 Claims, 5 Drawing Sheets

METER APPARATUS HAVING THREE-PHASE JUDGMENT FUNCTION

FIELD OF THE INVENTION

The present invention relates to a meter apparatus, and especially relates to a meter apparatus having three-phase judgment function.

DESCRIPTION OF PRIOR ART

Multimeters and clamp meters are both common electronic measurement apparatuses. A clamp meter measures current in a conductor (for example, an electric wire) without having to make electrical connection.

Measuring three-phase of power and rotation direction of a three-phase motor is very important for motor technology. Incorrect connection between power and motor might damage the motor. However, most of the apparatuses with measuring three-phase of power and rotation direction of three-phase motor functions are complicated and not integrated (because the electricity value of power is very large, but electricity value of the three-phase motor is very small). Therefore, it is very important to design a simple and integrated apparatus with measuring three-phase of power and rotation direction of three-phase motor functions.

SUMMARY OF THE INVENTION

In order to solve the above-mentioned problems, an object of the present invention is to provide a meter apparatus having three-phase judgment function.

In order to achieve the object of the present invention mentioned above, the meter apparatus having three-phase judgment function of the present invention includes a control unit, a multimeter measurement unit electrically connected to the control unit, a three-phase judgment unit electrically connected to the control unit, a first measurement jack electrically connected to the multimeter measurement unit and the three-phase judgment unit, a second measurement jack electrically connected to the multimeter measurement unit and the three-phase judgment unit, and a third measurement jack electrically connected to the multimeter measurement unit and the three-phase judgment unit.

DETAILED DESCRIPTION OF THE INVENTION

Figure 1:
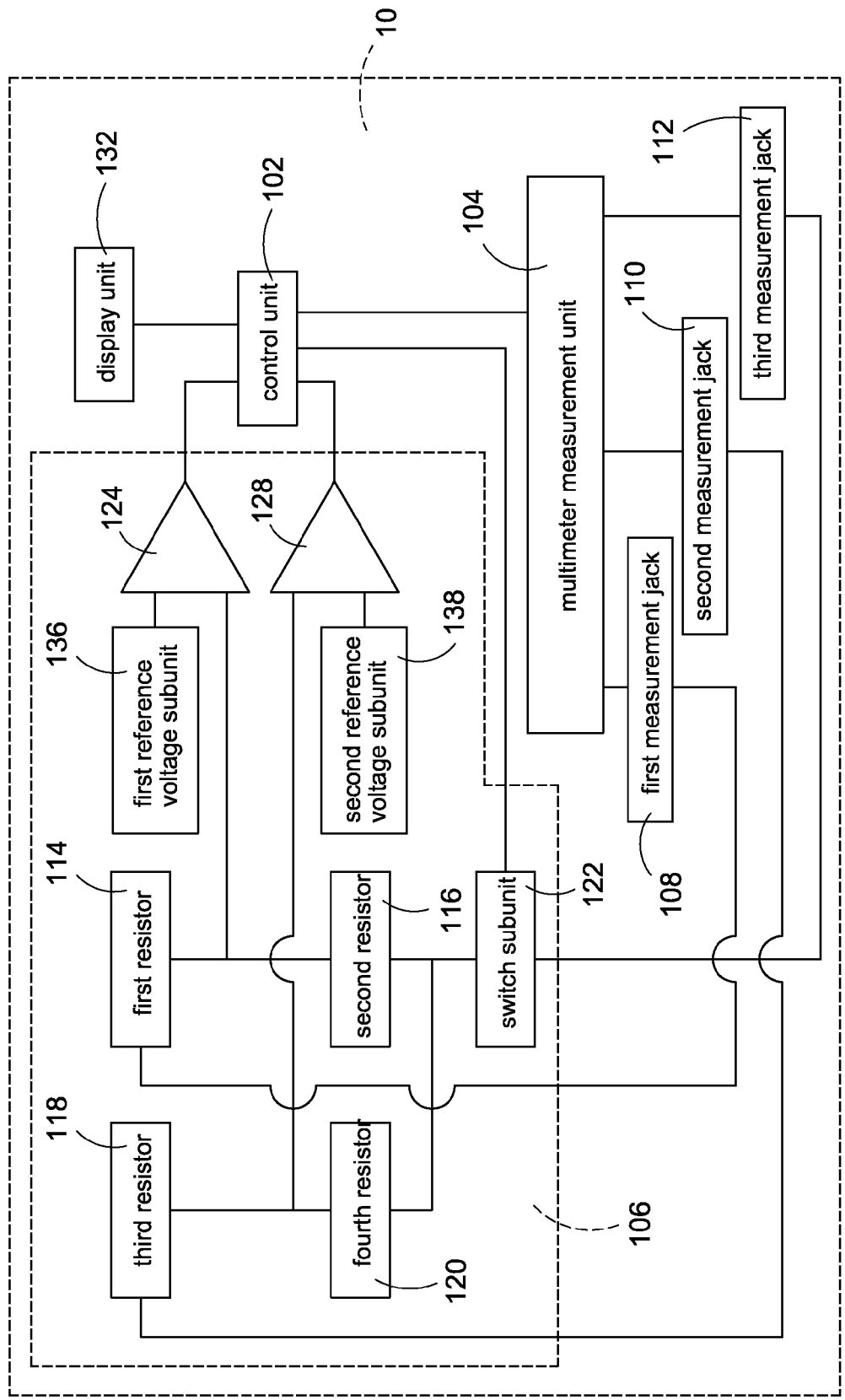
FIG. 1 shows a block diagram of the first embodiment of the meter apparatus having three-phase judgment function of the present invention.

FIG. 1 shows a block diagram of the first embodiment of the meter apparatus having three-phase judgment function of the present invention. The meter apparatus 10 having three-phase judgment function of the present invention includes a control unit 102, a multimeter measurement unit 104, a three-phase judgment unit 106, a first measurement jack 108, a second measurement jack 110, a third measurement jack 112, and a display unit 132. The three-phase judgment unit 106 is used to judge the three-phase of power (not shown in FIG. 1) or rotation direction of a three-phase motor (not shown in FIG. 1).

The three-phase judgment unit 106 includes a first resistor 114, a second resistor 116, a third resistor 118, a fourth resistor 120, a switch subunit 122, a first comparator 124, a first reference voltage subunit 136, a second comparator 128, and a second reference voltage subunit 138.

The control unit 102 is electrically connected to the multimeter measurement unit 104, the display unit 132, the output side of the first comparator 124, the output side of the second comparator 128, and the switch subunit 122.

The first measurement jack 108 is electrically connected to the multimeter measurement unit 104 and one side of the first resistor 114. The second measurement jack 110 is electrically connected to the multimeter measurement unit 104 and one side of the third resistor 118. The third measurement jack 112 is electrically connected to the multimeter measurement unit 104 and the switch subunit 122. The switch subunit 122 is electrically connected to the other side of the second resistor 116 and the other side of the fourth resistor 120.

The first input side of the first comparator 124 is electrically connected to the other side of the first resistor 114 and one side of the second resistor 116. The second input side of the first comparator 124 is electrically connected to the first reference voltage subunit 136. The first input side of the second comparator 128 is electrically connected to the other side of the third resistor 118 and one side of the fourth resistor 120. The second input side of the second comparator 128 is electrically connected to the second reference voltage subunit 138.

The meter apparatus 10 having three-phase judgment function is, for example, a multimeter or a clamp meter. The multimeter measurement unit 104 is a circuit for measuring resistors, voltages, or currents etc. The first measurement jack 108, the second measurement jack 110, and the third measurement jack 112 are used to connect to power or the three-phase motor to measure three-phase of power or the rotation direction of the three-phase motor. The display unit 132 is used to display the measurement results of the three-phase of power or the rotation direction of the three-phase motor.

The switch subunit 122 is controlled by the control unit 102 to control the second resistor 116 and the fourth resistor 120 to have no electrical connection with the third measurement jack 112 when the rotation direction of the three-phase motor is measured by the meter apparatus 10.

Figure 4:
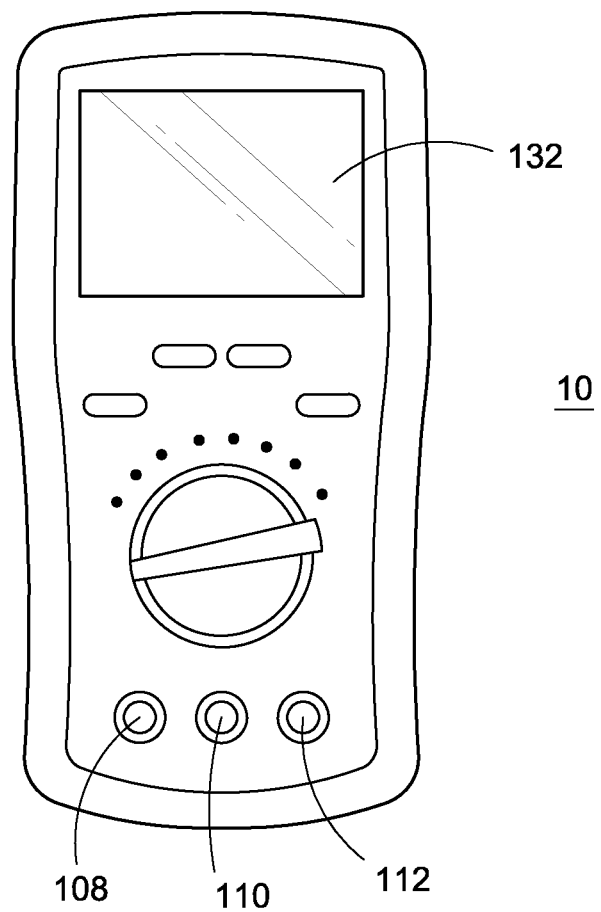
FIG. 4 shows a diagram of an embodiment of the meter apparatus having three-phase judgment function of the present invention (multimeter).
Figure 5:
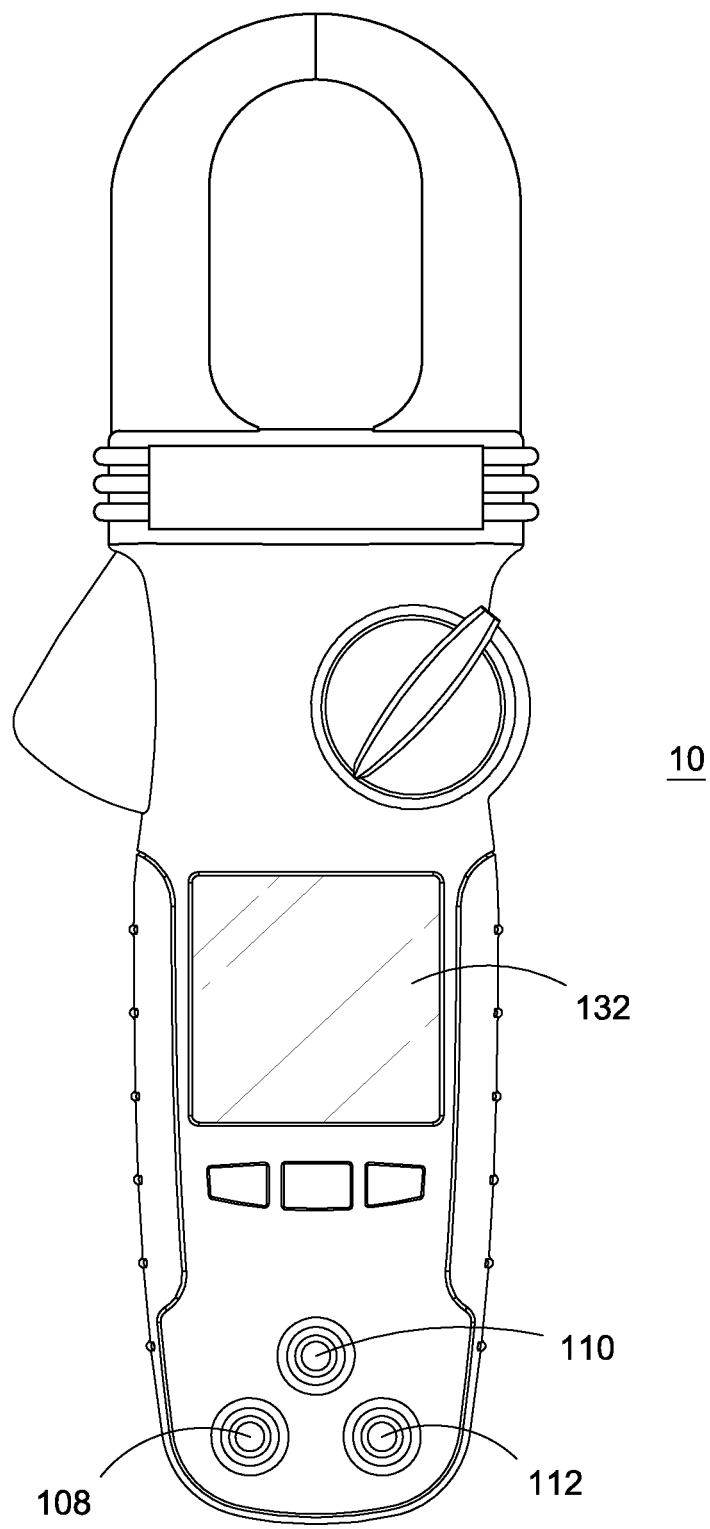
FIG. 5 shows a diagram of another embodiment of the meter apparatus having three-phase judgment function of the present invention (clamp meter).

FIG. 4 shows a diagram of an embodiment of the meter apparatus having three-phase judgment function of the present invention (multimeter). FIG. 5 shows a diagram of another embodiment of the meter apparatus having three-phase judgment function of the present invention (clamp meter). The circuit design of the meter apparatus 10 is simple and integrated. The meter apparatus 10 can measure the three-phase of power or the rotation direction of the three-phase motor, and has the functions of the multimeter as well.

Figure 2:
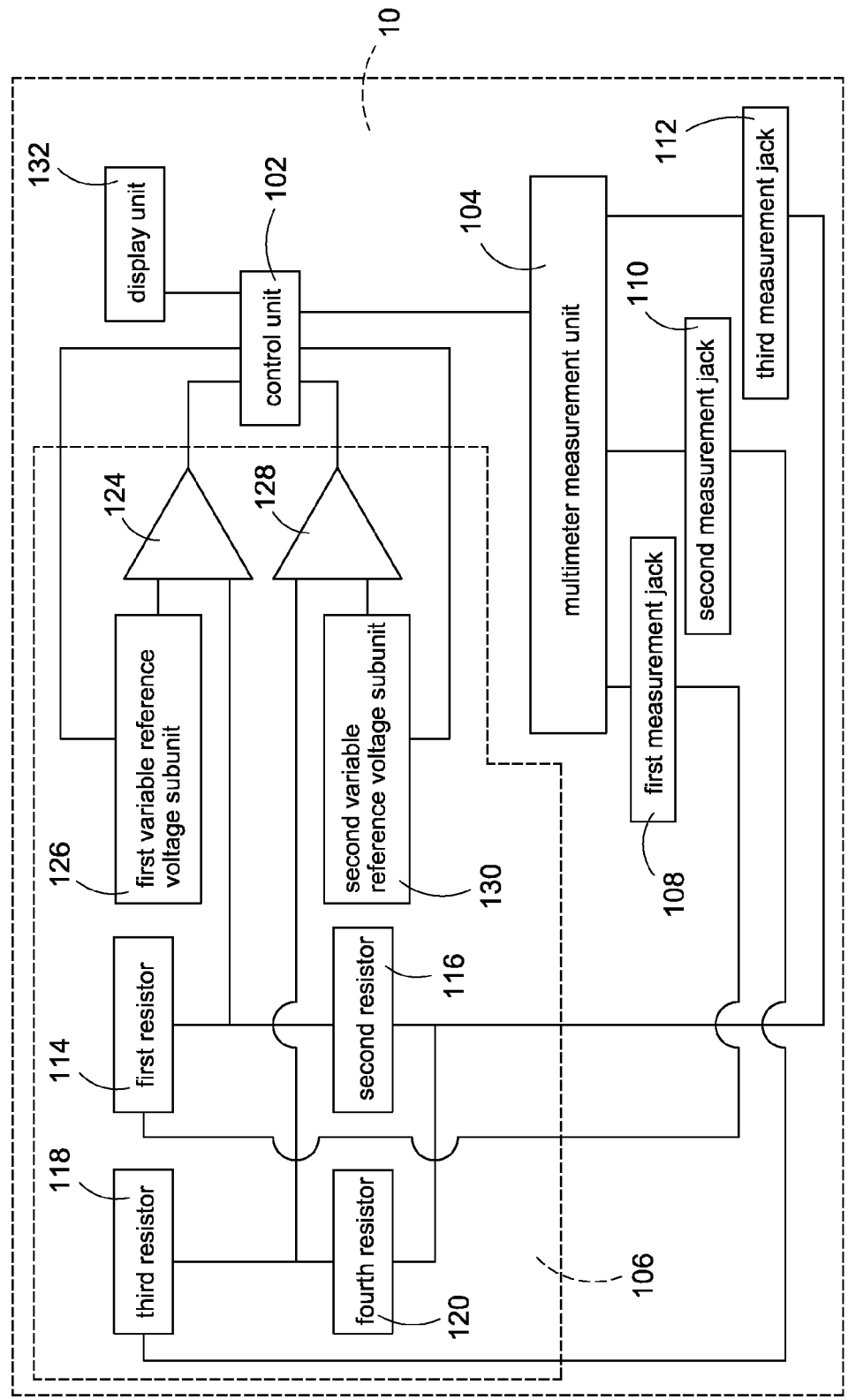
FIG. 2 shows a block diagram of the second embodiment of the meter apparatus having three-phase judgment function of the present invention.

FIG. 2 shows a block diagram of the second embodiment of the meter apparatus having three-phase judgment function of the present invention. The meter apparatus 10 having three-phase judgment function of the present invention includes a control unit 102, a multimeter measurement unit 104, a three-phase judgment unit 106, a first measurement jack 108, a second measurement jack 110, a third measurement jack 112, and a display unit 132. The three-phase judgment unit 106 is used to judge the three-phase of power (not shown in FIG. 2) or rotation direction of a three-phase motor (not shown in FIG. 2).

The three-phase judgment unit 106 includes a first resistor 114, a second resistor 116, a third resistor 118, a fourth resistor 120, a first comparator 124, a first variable reference voltage subunit 126, a second comparator 128, and a second variable reference voltage subunit 130.

The control unit 102 is electrically connected to the multimeter measurement unit 104, the display unit 132, the output side of the first comparator 124, the output side of the second comparator 128, the first variable reference voltage subunit 126, and the second variable reference voltage subunit 130.

The first measurement jack 108 is electrically connected to the multimeter measurement unit 104 and one side of the first resistor 114. The second measurement jack 110 is electrically connected to the multimeter measurement unit 104 and one side of the third resistor 118. The third measurement jack 112 is electrically connected to the multimeter measurement unit 104, the other side of the second resistor 116, and the other side of the fourth resistor 120.

The first input side of the first comparator 124 is electrically connected to the other side of the first resistor 114 and one side of the second resistor 116. The second input side of the first comparator 124 is electrically connected to the first variable reference voltage subunit 126. The first input side of the second comparator 128 is electrically connected to the other side of the third resistor 118 and one side of the fourth resistor 120. The second input side of the second comparator 128 is electrically connected to the second variable reference voltage subunit 130.

The meter apparatus 10 having three-phase judgment function is, for example, a multimeter or a clamp meter. The multimeter measurement unit 104 is a circuit for measuring resistors, voltages, or currents etc. The first measurement jack 108, the second measurement jack 110, and the third measurement jack 112 are used to connect to power or the three-phase motor to measure three-phase of power or the rotation direction of the three-phase motor. The display unit 132 is used to display the measurement results of the three-phase of power or the rotation direction of the three-phase motor.

The voltage levels of the first variable reference voltage subunit 126 and the second variable reference voltage subunit 130 are controlled by the control unit 102 when the rotation direction of the three-phase motor is measured by the meter apparatus 10.

FIG. 4 shows a diagram of an embodiment of the meter apparatus having three-phase judgment function of the present invention (multimeter). FIG. 5 shows a diagram of another embodiment of the meter apparatus having three-phase judgment function of the present invention (clamp meter). The circuit design of the meter apparatus 10 is simple and integrated. The meter apparatus 10 can measure the three-phase of power or the rotation direction of the three-phase motor, and has the functions of the multimeter as well.

Figure 3:
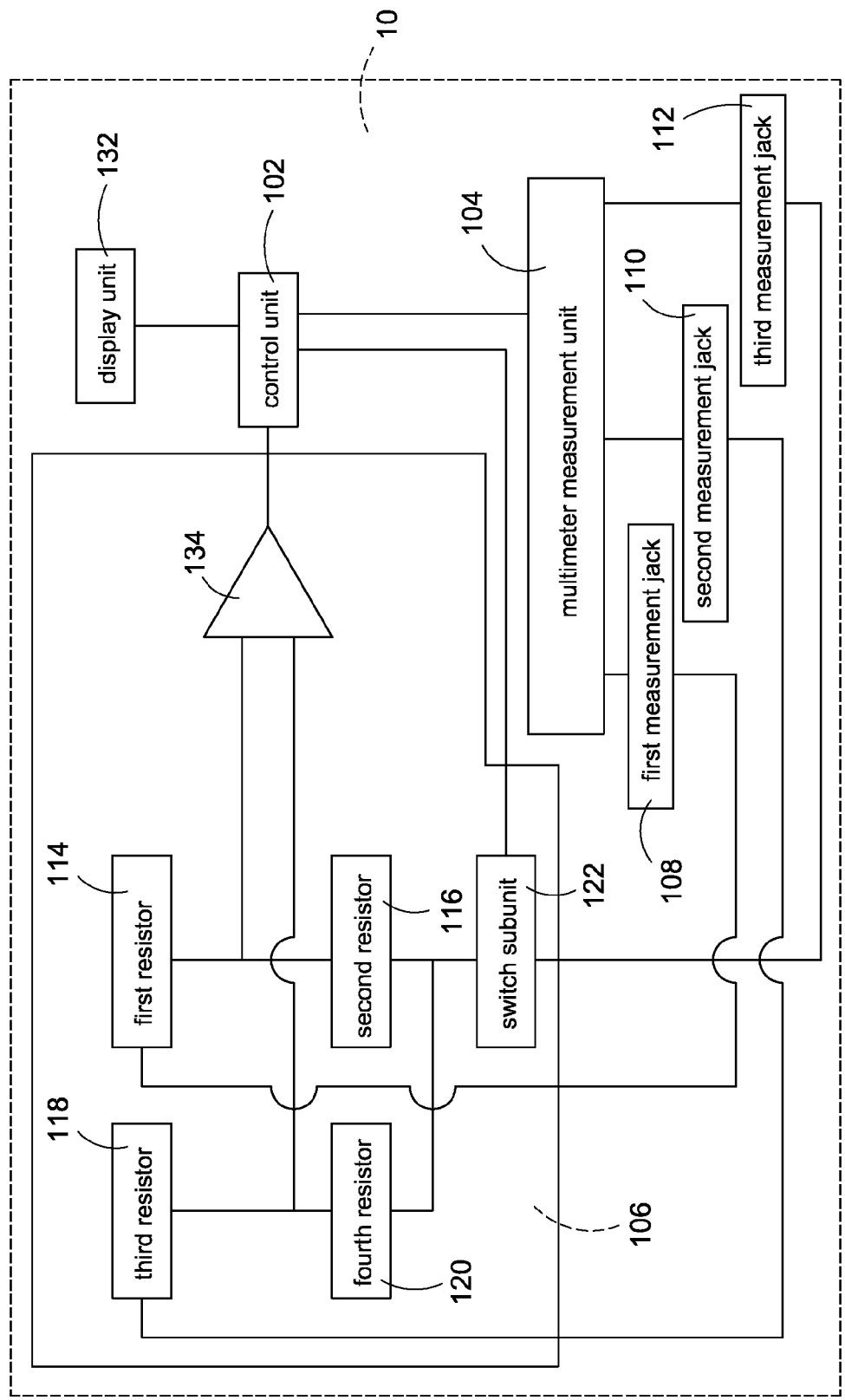
FIG. 3 shows a block diagram of the third embodiment of the meter apparatus having three-phase judgment function of the present invention.

FIG. 3 shows a block diagram of the third embodiment of the meter apparatus having three-phase judgment function of the present invention. The meter apparatus 10 having three-phase judgment function of the present invention includes a control unit 102, a multimeter measurement unit 104, a three-phase judgment unit 106, a first measurement jack 108, a second measurement jack 110, a third measurement jack 112, and a display unit 132. The three-phase judgment unit 106 is used to judge the three-phase of power (not shown in FIG. 3) or rotation direction of a three-phase motor (not shown in FIG. 3).

The three-phase judgment unit 106 includes a first resistor 114, a second resistor 116, a third resistor 118, a fourth resistor 120, a switch subunit 122, and a third comparator 134.

The control unit 102 is electrically connected to the multimeter measurement unit 104, the display unit 132, the output side of the third comparator 134, and the switch subunit 122.

The first measurement jack 108 is electrically connected to the multimeter measurement unit 104 and one side of the first resistor 114. The second measurement jack 110 is electrically connected to the multimeter measurement unit 104 and one side of the third resistor 118. The third measurement jack 112 is electrically connected to the multimeter measurement unit 104 and the switch subunit 122. The switch subunit 122 is electrically connected to the other side of the second resistor 116 and the other side of the fourth resistor 120.

The first input side of the third comparator 134 is electrically connected to the other side of the first resistor 114 and one side of the second resistor 116. The second input side of the third comparator 134 is electrically connected to the other side of the third resistor 118 and one side of the fourth resistor 120.

The meter apparatus 10 having three-phase judgment function is, for example, a multimeter or a clamp meter. The multimeter measurement unit 104 is a circuit for measuring resistors, voltages, or currents etc. The first measurement jack 108, the second measurement jack 110, and the third measurement jack 112 are used to connect to power or the three-phase motor to measure three-phase of power or the rotation direction of the three-phase motor. The display unit 132 is used to display the measurement results of the three-phase of power or the rotation direction of the three-phase motor.

The switch subunit 122 is controlled by the control unit 102 to control the second resistor 116 and the fourth resistor 120 to have no electric connection with the third measurement jack 112 when the rotation direction of the three-phase motor is measured by the meter apparatus 10.

FIG. 4 shows a diagram of an embodiment of the meter apparatus having three-phase judgment function of the present invention (multimeter). FIG. 5 shows a diagram of another embodiment of the meter apparatus having three-phase judgment function of the present invention (clamp meter). The circuit design of the meter apparatus 10 is simple and integrated. The meter apparatus 10 can measure the three-phase of power or the rotation direction of the three-phase motor, and has the functions of the multimeter as well.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:
1. A meter apparatus having three-phase judgment function including:
    a control unit;
    a multimeter measurement unit electrically connected to the control unit;
    a three-phase judgment unit electrically connected to the control unit;

a first measurement jack electrically connected to the multimeter measurement unit and the three-phase judgment unit;

a second measurement jack electrically connected to the multimeter measurement unit and the three-phase judgment unit; and a third measurement jack electrically connected to the multimeter measurement unit and the three-phase judgment unit, wherein the three-phase judgment unit includes:

a first resistor, one side of the first resistor electrically connected to the first measurement jack;

a second resistor, one side of the second resistor electrically connected to the other side of the first resistor;

a third resistor, one side of the third resistor electrically connected to the second measurement jack;

a fourth resistor, one side of the fourth resistor electrically connected to the other side of the third resistor;

a switch subunit electrically connected to the other side of the second resistor and the other side of the fourth resistor, and directly connected to the control unit and the third measurement jack;

a first comparator, the first input side of the first comparator electrically connected to the other side of the first resistor and one side of the second resistor, the output side of the first comparator directly connected to the control unit;

a first reference voltage subunit electrically connected to the second input side of the first comparator;

a second comparator, the first input side of the second comparator electrically connected to the other side of the third resistor and one side of the fourth resistor, the output side of the second comparator electrically connected to the control unit; and a second reference voltage subunit electrically connected to the second input side of the second comparator, wherein the switch subunit is controlled by the control unit to control the second resistor and the fourth resistor to have no electrical connection with the third measurement jack when the rotation direction of the three-phase motor is measured by the meter apparatus.

2. The meter apparatus having three-phase judgment function in claim 1, further including a display unit electrically connected to the control unit.

3. The meter apparatus having three-phase judgment function in claim 2, wherein the meter apparatus having three-phase judgment function is a multimeter or a clamp meter.

* * * * *